United States Patent [19]
Sweatt et al.

[11] Patent Number: 5,948,468
[45] Date of Patent: Sep. 7, 1999

[54] METHOD FOR CORRECTING IMPERFECTIONS ON A SURFACE

[75] Inventors: William C. Sweatt; John W. Weed, both of Albuquerque, N.Mex.

[73] Assignee: Sandia Corporation, Albuquerque, N.Mex.

[21] Appl. No.: 08/850,665

[22] Filed: May 1, 1997

[51] Int. Cl.$^6$ ..................................................... B32B 35/00
[52] U.S. Cl. ..................... 427/140; 427/282; 427/248.1
[58] Field of Search ..................................... 427/140, 282, 427/248.1

[56] References Cited

U.S. PATENT DOCUMENTS 4,902,530  2/1990  Yasaka et al. .......................... 427/282

Primary Examiner—Janyce Bell
Attorney, Agent, or Firm—Gregory A. Cone

[57] ABSTRACT

A process for producing near perfect optical surfaces. A previously polished optical surface is measured to determine its deviations from the desired perfect surface. A multi-aperture mask is designed based on this measurement and fabricated such that deposition through the mask will correct the deviations in the surface to an acceptable level. Various mask geometries can be used: variable individual aperture sizes using a fixed grid for the apertures or fixed aperture sizes using a variable aperture spacing. The imperfections are filled in using a vacuum deposition process with a very thin thickness of material such as silicon monoxide to produce an amorphous surface that bonds well to a glass substrate.

17 Claims, 7 Drawing Sheets

Source, Mask and Substrate line pairs per mm — — →
Fourier transform for square grid of holes to mask Definition of Source Image S(x,y)

Definition of Mask Image T(x,y)

METHOD FOR CORRECTING IMPERFECTIONS ON A SURFACE

STATEMENT REGARDING FEDERALLY SPONSORED RESEARCH OR DEVELOPMENT

This invention was made with Government support under Contract DE-AC04-95AL85000 awarded by the U.S. Department of Energy. The Government has certain rights in this invention.

CROSS-REFERENCE TO RELATED APPLICATIONS

None.

REFERENCE TO A MICROFICHE APPENDIX

None.

BACKGROUND OF THE INVENTION

This invention relates to a method for correcting deviations in a surface that are created by manufacturing processes. More particularly, this invention relates to a method for correcting optical surfaces having such imperfections. Still more particularly, this method relates to a method for filling in lap marks created during the manufacture of aspheric reflective optical surfaces to create a near perfect optical surface.

Although the process of this invention has been reduced to practice in the context of reflective aspheric optical surfaces useful in extreme ultraviolet lithography processes using 13.4 nm radiation, this process is applicable to the correction of imperfections in a wider realm of surfaces where a near perfect surface is necessary.

There are several technologies for correcting the wavefront of optical surfaces including: sub-aperture polishing, ion milling, through a mask with a single large hole, and binary optics. Sub-aperture computer controlled polishing produces the best aspheric optical surfaces presently available. This process starts with a near perfect spherical surface produced by a conventional technique followed by controlled polishing with a small (sub-aperture) lap to accommodate the deviation from a sphere. With such a technique, the aspheric surface can be polished in, and low-spatial-frequency errors such as third-order astigmatism and coma can be polished out. The very best resulting mirror surfaces have RMS roughnesses of about 1 nm composed of mid-spatial frequency aberrations—an unfortunate side effect of using a small polishing lap. These are the errors the present technique would remedy; they are largely uncorrelated "valleys" and "hills" with characteristic widths that range from 2 mm to 30 mm on a 100 mm substrate.

Ion milling can be used to level high spots on an optical surface. However, it leaves an optically rough surface because of grain boundaries and subsurface damage. Research is on-going to ameliorate these subsurface damage effects.

Mild aspheres are being made commercially using coating processes similar to the present process. However, the masks used in these commercial processes contain only a single large aperture or a relatively few apertures that do not provide adequate deposition overlap for the high accuracy corrections produced by the present invention. These apertures are designed so the deposition is heavier where the parent surface needs to be built up. This technique works well when adding low-order spherical aberration to a surface, but it cannot be used to correct high order aberrations or mid-spatial frequency errors. These depositions were very much thicker (hundreds of microns) than those contemplated herein. These thick depositions create a surface roughness level, about 1% RMS of the deposition thickness, that is unacceptable for many applications.

Finally, the use of binary optics can correct high order aberrations and mid-spatial frequency errors, however it is only useful for monochromatic applications. Furthermore, although it is a known technology and can reasonably be employed when the discrete steps remaining in the finished surface are not a problem, the steps resulting from binary optics correction scatter a minimum of 1–2% of the light which would be a problem when there are bright objects in the field and one needs to see faint ones. It may also cause trouble during the application of multi-layer reflective coatings for very short wavelengths, which is common practice.

The optical surface optimization process of this invention appears to be the only option for the highest performance systems operating at extremely short wavelengths, far below the visible region of the electromagnetic spectrum. This process will enable the manufacture of diffraction-limited optical systems for UV, extreme UV and soft X-ray spectral regions, which would have great impact on photolithography and astronomy. It is also applicable for use in the visible wavelength region.

SUMMARY OF THE INVENTION

This invention enables one to correct manufacturing imperfections in a surface. The surface is first profiled, typically by optical interferometry, and then the profile of the desired surface is subtracted from the measured profile to determine the deviations of the surface. A multi-aperture mask is then designed to have a transmission characteristic which, when used with a particular deposition source, will fill in the low spots on the surface as material is transmitted through the mask onto the surface. Thus, a custom mask is designed for each surface that will uniquely correct the surface errors on that particular surface. The ability of this process to correct errors in a surface becomes more and more valuable as the wavelengths get shorter and shorter. For reflective optics to be used at extreme UV wavelengths, the vertical errors to be corrected in the preferred embodiment described below are typically less than 5 nanometers (nm), the thickness of the material deposited will be about that much or less, and the tolerable level of surface roughness should be less than about 0.1 nm RMS. The discussion presented below will demonstrate how these levels of accuracy and surface smoothness may be achieved.

DETAILED DESCRIPTION OF THE INVENTION

The description set forth below is for one preferred embodiment used to produce surface corrections useful with an optical surface at wavelengths at about 13.4 nm (extreme UV) which required certain levels of accuracy of deposition and standards for surface roughness. This method is adaptable to use for other surfaces with different requirements.

The process begins with an optic polished as near to the desired shape as possible using conventional techniques. Using interferometry, the surface error is measured which enables design of a corrective mask and corresponding deposition geometry. Finally the mask provides preferential filling guidance during the thin film deposition process. A Zygo Mark IV optical interferometer was selected for the measurement of optical figure. This instrument is a computerized phase-shifting interferometer that allows computer acquisition of the optical figure information and post processing of the data, including fitting with Zernike polynomials for an approximate mathematical description of the optical surface. An atomic force microscope (AFM) yielded surface roughness measurements. This instrument was a Digital Instruments Dimension 3000 operating a tapping mode that can allow surface profiling with a height resolution of less than an angstrom and a lateral resolution of ten nanometers. The data are in digital form that can be displayed as 3D surface profiles or analyzed in cross section. An optical surface profilometer, consisting of an automated phase-shifting interference microscope, was used for analysis of larger scale surface roughness form preliminary deposition mask experiments.

Figure 1:
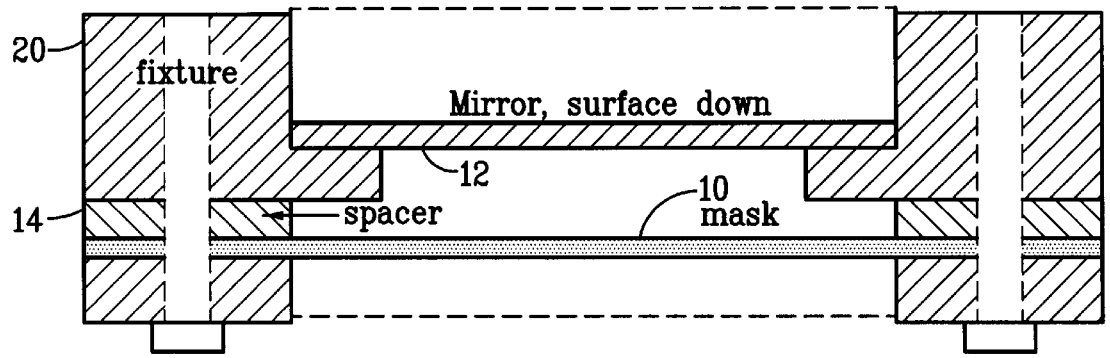
FIG. 1 is a cross-sectional schematic view of the mirror and mask held in a fixture.
Figure 2:
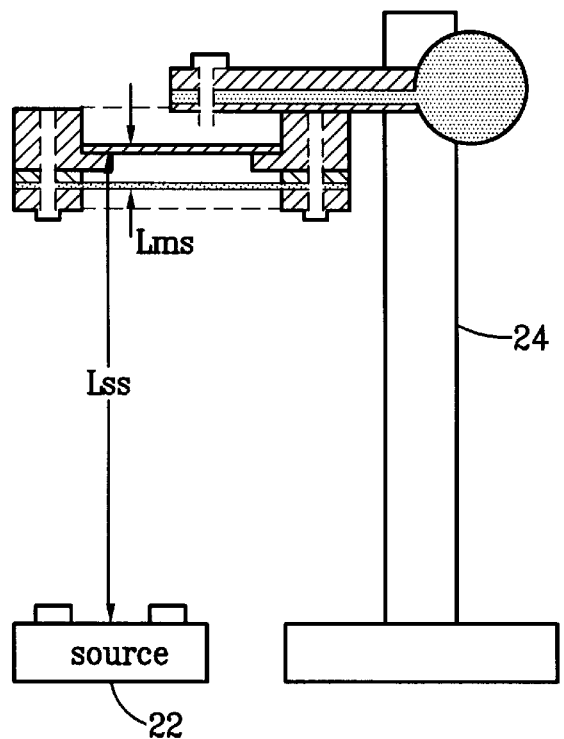
FIG. 2 is a schematic view of the fixture holding the mirror and the mask in combination with the deposition source showing various dimensions.

The deposition geometry is shown in FIGS. 1 and 2; the fixture 20 and the mount 24 control the source-to-substrate $L_{s-s}$ and mask-to-substrate $L_{m-s}$ separations. Depositions were performed in the Thin Film Laboratory at Sandia National Laboratories. A mask with a square array of tiny holes is mounted, as shown, a few centimeters below a down-ward facing, super-polished optical surface 12. The evaporation source 20 emits a uniform flow of neutral SiO molecules that move ballistically and adhere either to the mask or pass through the holes and deposit on the surface of the optic. The spacing between centers of the holes in the square array is 100 microns. The hole diameters range from 30 to 70 microns which allows the locally averaged transmission of the mask to be varied. Each hole in the mask acts like a pinhole camera which images the source on the optic. Typically the source has a diameter of 20 mm which creates a 2-mm image on the optic, $L_{m-s}/L_{s-s}=10$. The holes in the mask are 100 microns apart, so any spot on the optic is "seeing" the source through about 300 holes. Thus there is a lot of averaging and smoothing taking place, and the concept of a local "average" transmission makes sense. The 2-mm source image and high density hole pattern is therefore designed to be able to differentially fill in the 2-mm to 30-mm wide low spots on these mirrors that were produced by the sub-aperture lapping process used to produce the aspheric surface.

The deposition mask design code is based on a Fourier transform algorithm and is written in FORTRAN to run on a high performance work station. The output of the design code is a list of x,y hole coordinates and a hole diameter for each coordinate in a large ASCII file. The hole (aperture) size can be varied from 30 to 70 microns in diameter in the design used here. The upper limit is imposed by the center-to-center distance (100 microns) of the current hole array and the lower limit is imposed by the desire to limit fabrication difficulty for the mask vendor. These limits could be exceeded in either direction to meet special requirements. The large ASCII file is in turn read by a program that transfers the data to an integrated circuit CAD system of a type commonly used in industry. The CAD system allows addition of features for alignment or test purposes and then can output a file in a format that commercial photomask and chemical milling vendors can use. The vendor fabricates a depostion mask with desired hole sizes by a photolithographic process combining chemical milling and electroforming. Electroforming is used to form the small holes in plated copper on a stainless steel substrate. The stainless steel behind the holes in then chemically milled away to provide a clear hole through the entrie structure. This process can be used to produce holes of a few microns diameter in a mask that is 75 microns thick.

Measurements of optical surface errors were received from a measurement services vendor as Zernike polynomial coefficients. A constant thickness minus this error represents the distribution of material necessary to repair the errors in the surface. Derivation of the actual thickness required for repair is explained below.

Figure 3:
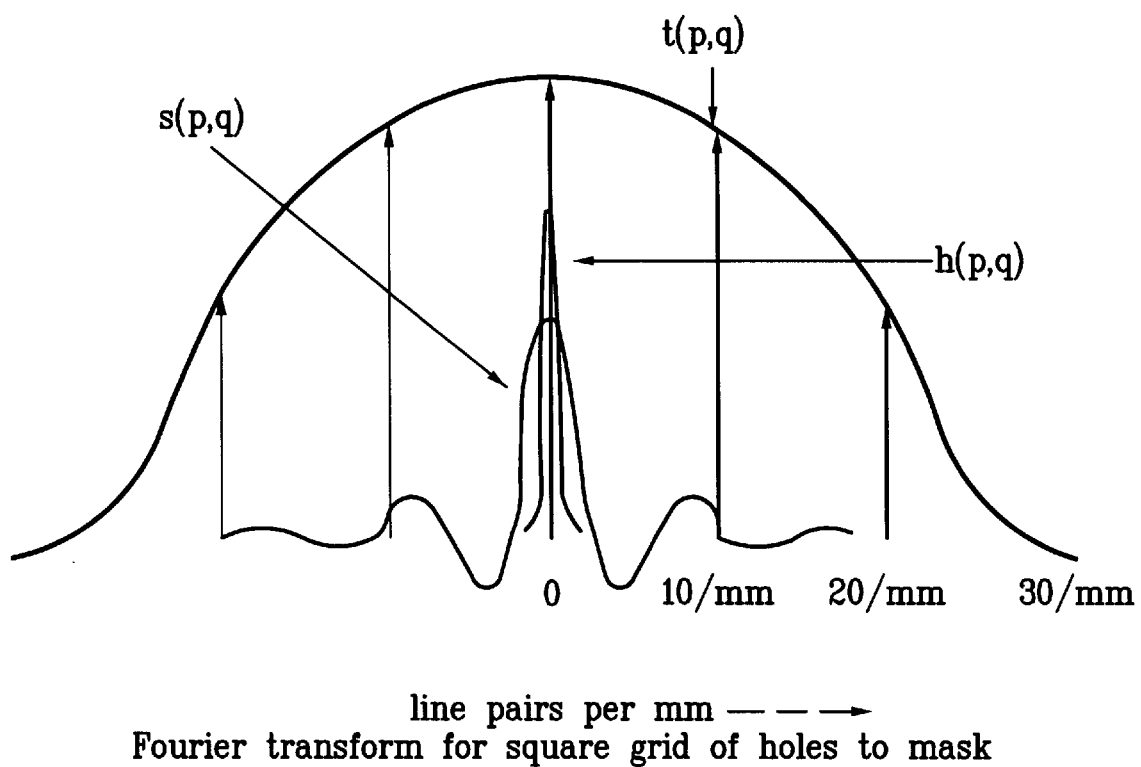
FIG. 3 is a diagram of the Fourier transforms of the transmission of the grid of aperture in the mask, the height of a surface feature, and the circular source aperture.

A succeeding section describes the details of the mathematics associated with the coating design process; the results are described here. Fourier transform (FT) theory plays the central role in this process because a function that is a convolution in the spatial domain will be a simple product in the FT, spatial frequency domain. Consider the relationship between the locally averaged transmission of the mask, T(x,y), and the height of the surface error of the optic, H(x,y). The 2 mm source image on the surface, S(x,y), is relatively large and would blur the fine detail of the mask. FIG. 3 shows the Fourier transforms of the source image, and of the 50-micron holes in a 100-micron square grid. Note that the "information content" of the surface error, and hence the mask pattern, does not overlap in spatial frequency content with that of the mask. Therefore their effects on the deposition can be considered separately. One can indeed calculate the local average transmission of the mask that will deposit a flat-topped layer on the optic—And separately, we can calculate the "micro-roughness" due to the D~50-micron hole size and spacing in the mask. Mathematically, this can be described as a convolution; that is, $$H(x,y)=T(x,y)**S(x,y)$$

where the double asterisk signifies a convolution operation in two dimensions. The transmission could be calculated from this expression, though a 2-D deconvolution would be laborious, would require a number of assumptions, and would provide very little insight into the process. Hence one can Fourier-transform this equation into the spatial frequency domain;

$$h(p,q)=t(p,q) \cdot s(p,q).$$

The coordinates, (p,q), represent spatial frequency in the x and y directions and have units of cycles/mm. This transformed relationship includes a product so both sides can be divided by the source term yielding an expression for the locally averaged mask transmission;

$$t(p,q)=h(p,q)/s(p,q).$$

One dimension of these transform functions is sketched in FIG. 3 and described below. This Figure shows three Fourier transforms of the source image s(p,q), the 50-micron holes in a 100-micron square grid t(p,q), and the FT of H(x,y), which describes the hills and valleys on the optic, h(p,q). The divisor of the above equation, s(p,q), is positive and non-zero in the lower frequencies where the information describing the optical surface is found.

The source function in FIG. 3 is the Fourier transform of a round, uniformly emitting source. This is the well known Sombrero function, $somb(p,q)=J_1(2\pi r)/(2\pi r)$. The mask function, t(p,q) is the wide envelope multiplied by the array of delta function, described further below. Also shown is an approximate frequency envelope of a typical surface with errors as small as 5 mm. A summary of the FT mask design algorithm is: first, smooth the interferogram of the surface and subtract the desired aspheric shape; second, take the FT of this and divide it by the FT of the source; and finally, take the inverse FT of this result which will yield the locally averaged mask transmission.

To calculate the micro-roughness, one can assume that all of the holes have 50 micron diameters in a local region. The mask can be mathematically described as a square grid of delta functions (a two-dimension comb function) on 100-micron centers convolved with a 50-micron diameter cylinder function, $$T(x,y)=comb[(x,y)/100]**cyl\ [(x,y)/50]$$

And, once again, the deposition is $$H(x,y)=T(x,y)**S(x,y)$$

These two equqtions can be combined and the Fourier transform taken, giving the FT of the surface height:

$$h(p,q)=H_o comb[100\ \mu m(p,q)] \cdot Somb[50\ \mu m(p,q)] \cdot Somb[2000\ \mu m(p,q)],$$

where $H_o$ is the average height of the deposition.

Referring back to FIG. 3 again: The delta functions and the sombrero represent the hole pattern in the mask, and the source sombrero is in the center. Remember that the FT of the coating's micro-roughness is the product of all three functions. The delta function representing the fundamental frequency is attenuated a little (~20%) by the sombrero representing the mask holes and a lot by the source term s(p,q). As is described in below in more detail, the sombrero representing the source can be approximated and the RMS height of the surface can be shown to be less than $$H_{RMS} \leq 0.0072\ H_o$$

Theoretically then, if the coating thickness is never greater than 15 nm, the RMS micro-roughness will be less than $H_{RMS} \leq 0.1$ nm. Meausurements on three sample depositions showed periodic errors less than this maximum.

The Fourier transform method for calculating the transmission of the mask is exact for flat mirrors (and flat masks). Here the mask-to-mirror distance is invariant and there is no cosine effect due to a slope on the mirror. And, when the mirror is only weakly curved, it is still a very good approximation and probably needs no improvement.

If the surface curves so that the mask-to-mirror distance changes by maybe 10% over the surface, one could still use the FT formulation after mapping the error to be corrected onto a flat surface tangent with the center of the mirror. The thickness near the edge will probably have to be scaled (multiplied by something similar to $(1+epsilon*r^4)$ where epsilon is significantly smaller than 1).

If the surface is steeply curved, one would just use brute force number crunching to calculate the mask transmission; and here is one possible approach:

first smooth the data, perhaps by FT, clip off high frequency components, and inverse FT.

second, map the highs and lows directly from the mirror to the mask while correcting for slope errors, then calculate the resulting deposition patterns.

third, continue to iterate until the simulation of the mask transmission yields an acceptable result. Then fabricate the mask and do the actual deposition.

Two other mask architectures were examined; one assumed that variable-sized holes were located on a fixed, hexagonal grid. The other was a study of fixed hole diameters with a grid that varied in one dimension. That is, all rows were separated by a fixed distance but each row had variable hole spacing in it, these variations changed from row to row. Both of these options reduced the micro-roughness but increased the cost of implementation considerably. The decision was to use a square grid because of its simplicity, while understanding that better results were possible using the alternative strategies.

Vacuum evaporation was chosen as the deposition process because it produces an atomistic flux that is ballistic, predictable, and repeatable. The flux can then be modified by the transmission mask to produce the desired film. Silicon monoxide (SiO) was chosen as the deposition material for several reasons. Primarily SiO has a reputation for condensing as an amorphous thin film when evaporated. It is believed that an amorphous material, compared to a crystalline material, will produce a film with lower residual surface roughness and will thus preserve the super polished character of the initial optic. SiO was also chosen because there are commercially-available, resistance heated, sources specifically designed for SiO evaporation. These sources have been used for many years and produce a symmetrical, molecular beam. The beam, or flux, varies in density across its radius by a cosine power function that is dependent on the geometry of the source. Once characterized at a given deposition rate, the flux is easily modeled. Finally we expected that SiO would adhere well to optics made of $SiO_2$ or Zerodur. This technology may be extendible to other materials. For example, there are numerous exotic infrared (IR) refractive materials that are extremely difficult to polish because they are quite soft or somewhat soluble in water. One could ask the optician for a smooth surface with loose wavefront tolerances and then fix it with this technology and an appropriate evaporant.

The deposition system consists of a standard stainless steel vacuum chamber with a cryogenic high vacuum pump. The chamber achieves pressures of $10^{-7}$ Torr with overnight pump-down. The evaporation apparatus includes the commercially available source, a quartz crystal micro-balance (QCM) deposition controller from Leybold Inficon, model IC/4+, and a vacuum compatible optical mount. As depicted in FIG. 2, the mask 10 and optic 12 are loaded into the fixture 20 which is then precisely positioned over the source 22 with the optical mount 24. The source to optic distance can be varied by moving the fixture along the mount. The mask to optic distance can be varied by changing the spacer rings 14 separating the two. A typical deposition rate is 10 Å per second and is closed loop controlled by the QCM. The QCM also shuts off the flux and thus controls the film thickness.

To prepare for a deposition run, the mask and optic are fixtured and the system is evacuated below $10^{-6}$ Torr. The evaporation source is powered with a low voltage, high current supply which heats the SiO to a temperature that produces a 10 Å per second rate at the optic's surface. The QCM controls the film deposition from start to finish. No ancillary heaters are used to heat the optic during deposition. When the run is completed, the system is vented with nitrogen and the optic removed.

Surface micro-roughness was measured using an atomic force microscope (AFM) and, although contact and tapping modes yielded the same results, tapping mode may cause less surface damage. One of the super-polished optics was tested both before and after SiO depositions. AFM measurements of a 300 Å (0.17 nm RMS, the same as the un-coated optic) imply that this may be correct–that the SiO deposition contributes little micro-roughness. This contribution to the micro-roughness is acceptable, though a number twice this large would be worrisome for the extreme UV photolithography application.

When depositions on optical surfaces were performed, they were compared with theoretical predictions, and the expected deposition layer was calculated using a model for the source that took into account the slight variations from a simple "top-hat" flux distribution. These predictions were found to be in agreement with depositions made through special test masks, to within the capability of the instruments to measure the deposited layers. The effect of the discretization of the transmission function by varying hole diameters in a pattern of holes in the mask is clearly seen in computed results and in the results experimentally obtained. For present purposes, this "ripple" effect can be made small in comparison to either the errors being considered, or with one's ability to discern error in an optical surface, for state of the art surfaces.

Figure 10:
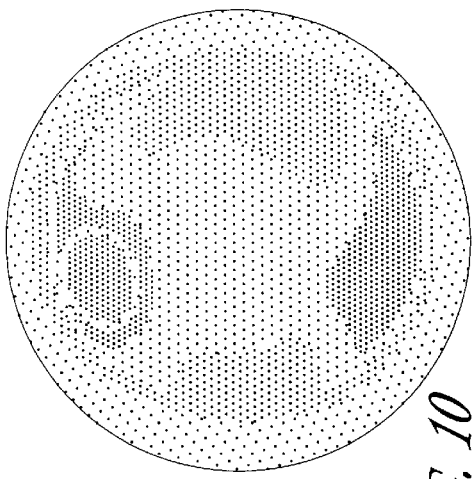
FIG. 10 is a plot of the smoothed error correction (polynomial fit) that needs to be made and that is one of the determinants of the mask design.
Figure 12:
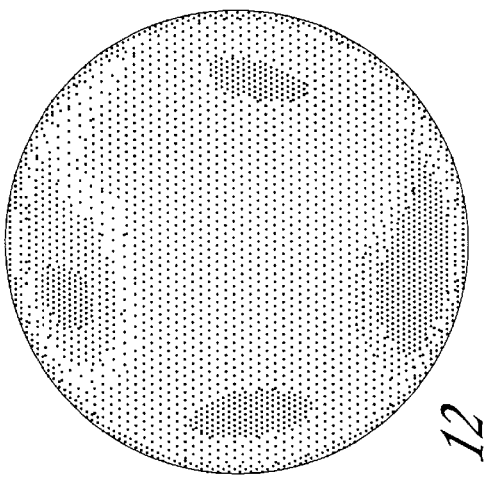
FIG. 12 is a plot of the surface profile (interferogram) of the material deposited on a good (unaltered) optical flat through the mask created to do so. The top and bottom regions are low and the side regions are high.
Figure 9:
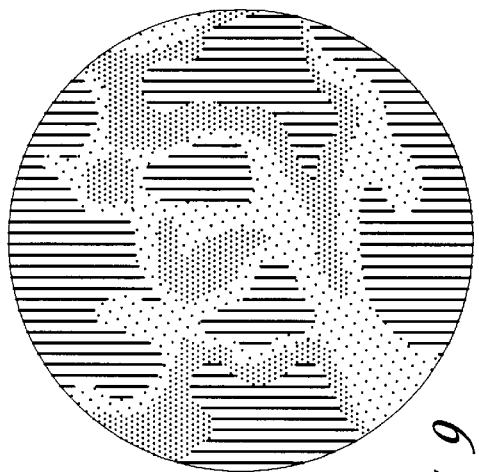
FIG. 9 is a plot of the surface profile (interferogram) of an aberrated optical flat mirror wherein the maximum height differential is about 20 nm. The vertically lined areas on the left and right are low and the others are high.
Figure 11:
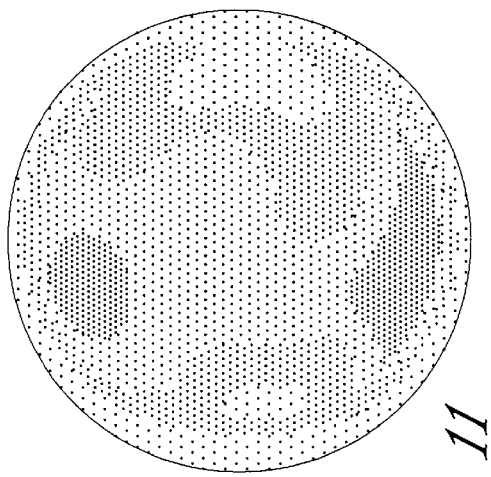
FIG. 11 is a grey scale plot of the calculated deposition profile that would result from the mask.

Though only one aberrated optic was processed, the multi-aperture mask for that optic generated precisely what it was designed to produce, and the deposition process worked as expected. The results are shown in FIGS. 9, 10 and 11. It is the additional detail in modeling the aberration which needs further improvement. FIG. 10 shows the smoothed error profile that was used to design the mask. The error was smoothed somewhat over much. This can be corrected by using spline functions to better fit the aberration data to subsequently generate a higher resolution correction mask. With few exceptions, the process for correcting the imperfect optical surface performed as expected. One exception is the aforementioned resolution of the aberration model. Additionally, the Fourier transform method of modeling the aberration is not as effective near the edges; however, modification of the formalism using some type of filter could be used to minimize such edge effects. Finally, the correction could be enhanced through improved fiducial marks for alignment of the optic with the correction mask.

Athough the specific embodiment herein required very thin coatings, the maximum practical thickness of the material deposited through the mask for optical mirrors for this process will be something less than about 600 nm. Depositions below this thickness level of SiO on glass will largely avoid the two detrimental effects of significant crystal (surface roughness) and thermal expansion mismatch between the dissimilar layers (warping with temperature changes.

The number of apertures in the masks produced for the preferred embodiments was on the order of 200,000. A smaller diameter surface would have a smaller mask and fewer holes. The important characteristic is to have enough overlap of deposition from different apertures that any one spot on the surface with receive material through at least about 75 different apertures. This preserves the averaging effect between apertures that is important to producing the smooth deposition. The preferred embodiment overlapped about 300 apertures.

The following sections describe in much more detail certain aspects of the invention.

Modeling

In the development of this process, the goal was to reduce the wavefront errors of very good mirrors to the point that they are unmeasurable. The mirrors can be polished to an RMS surface error of less than one nanometer, but the need was to reduce this by a factor of ten. To smooth the surface one deposits a thin coating on it using a variable transmission mask to modulate the thickness. With the mathematics presented here, one can expect to be able to model the deposition both macroscopically and microscopically. Only two assumptions need to be made: 1.) The flux from the evaporative source is assumed to fill the exit aperture uniformly, and 2.) there is no significant scattering outside the source. Both assumptions seem to be borne out by the initial tests conducted.

The mirrors are about 80 mm in diameter and the spatial frequencies of the surface errors that need to be fixed are $\eta_{mirror} \leq 0.2$ mm$^-$. The spatial frequencies associated with the circular source exit aperture are plotted in the center of the figure. The frequencies describing the local effects due to the 2-D array of holes in the mask are quite a bit higher than those described above. The holes are located on 100-mm centers so the fundamental frequency in the "ripple" will be $\eta_{fundamental} = 10$ waves/mm.

Note that the frequencies of the errors to be fixed and those associated with the ripple are separated by almost two orders of magnitude. Hence they can be analyzed separately. For the macroscopic problem, the mask transmission can be assumed to be smoothly varying which allows it to be calculated in a fairly straight forward manner. The ripple associated with the hole pattern can be analyzed assuming the holes are all of equal size, which will be true locally.

In the next section is presented an analysis of the macroscopic problem showing how the smoothed transmission of the mask can be calculated from an interferogram of the mirror. In the following sections the ripple is studied. This gives insight about the optimum grid spacing, range of hole sizes, mask-to-substrate separation, and hole pattern regarding whether it should be square, hexagonal, or variable. It also leads one to the conclusion that the minimum average coating thickness that allows the wavefront errors to be corrected is to be desired.

Computing the Global Transmission of the Mask

The problem is to correct a mirror substrate with a wavefront error. This surface height error could be defined as H(x,y). There are two other parameters that also need to be defined; the image of the mask transmission on the substrate, T(x,y), and the source image on the substrate, S(x,y). The image of the mask on the substrate is the deposition that one would get with only a point source of material rather than an extended source (FIG. 3a). The source image is the deposition one would get using the real source and a mask with a vanishingly small hole in it (FIG. 3b).

With these definitions, the deposition on the surface is the convolution of them;

$$H(x,y)=T(x,y)**S(x,y). \quad (1)$$

H(x,y) and S(x,y) are known, and one needs to determine the transmission of the mask, T(x,y). It can be determined by simply deconvolving the deposition function, H(x,y) though this approach gives very little insight that would help to design the process. A more instructive approach, and perhaps an easier one uses Fourier transforms to simplify the analysis. One can take the Fourier transform of the Equation (1) which changes the convolution into a simple product. Then both sides of the equation can be divided by the transform of the source, and finally, the results must be transformed back into dimensional coordinates.

The Fourier transform of the height function, Equation (1), is thus $$h(a,b)=t(a,b)\cdot s(a,b), \quad (2)$$

where the lower case letters denote Fourier transforms and a,b are variables with units of spatial frequency (1/mm). One next divides through by S(a,b) giving the transform of the mask transmission, $$t(a,b)=h(a,b)/s(a,b). \quad (3)$$

Figure 4:
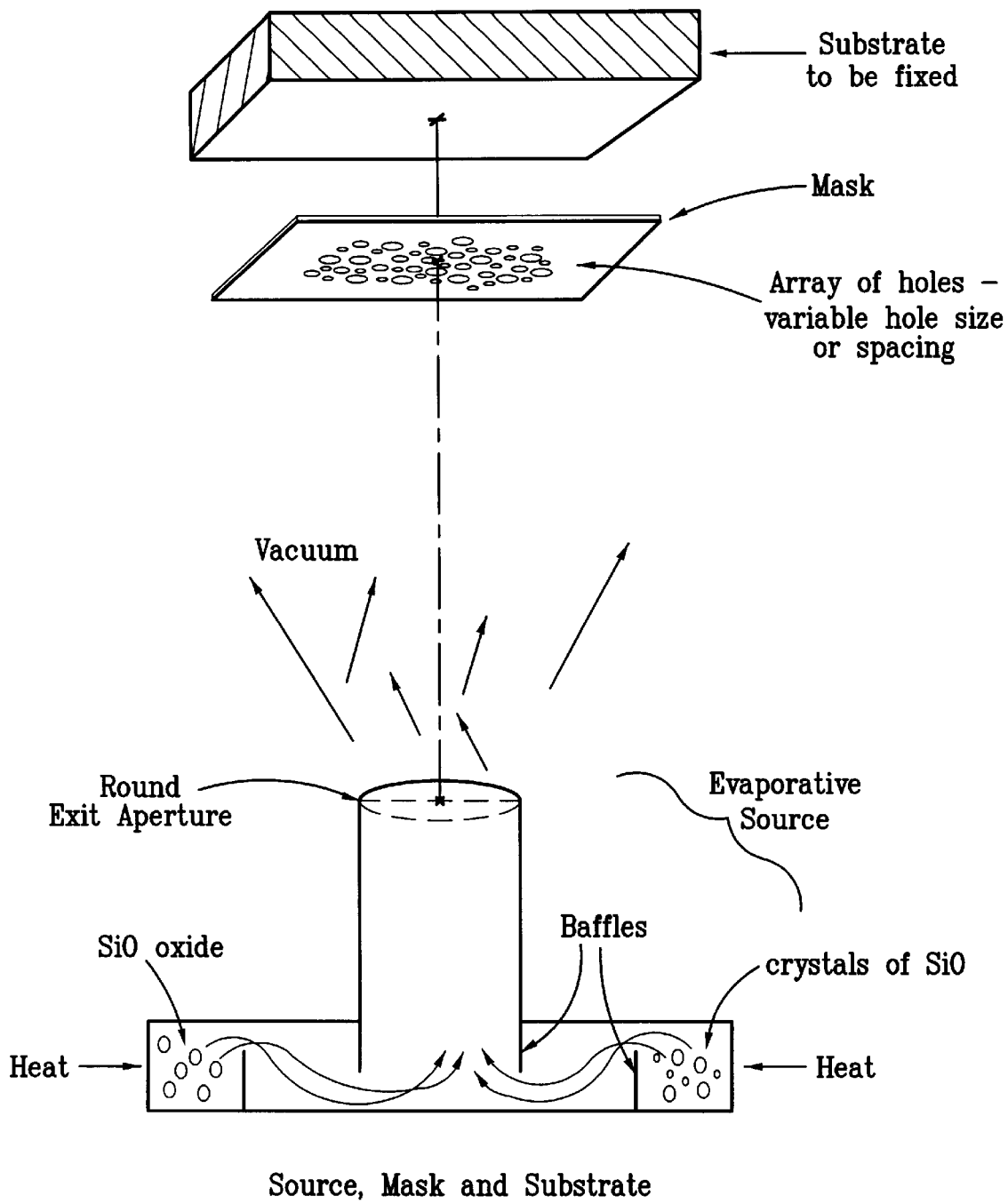
FIG. 4 is an isometric schematic view of the source, mask and surface.

This operation is legitimate when the transform of the source, $s(a,b) \neq 0$, is nonzero where h(a,b) is defined. This is the case when the source image on the substrate is considerably smaller than the errors to be fixed. In this case the frequencies for the errors are smaller than $\eta_{wavefront} \leq 0.2$ mm$^{-1}$ which corresponds to the spatial frequency components in 2-mm bumps and holes on the substrate. The transform of a source with $D_{source\ image} \approx 3$ mm is well behaved in this region; in fact, it only varies from $1 \geq s(a,b) \geq 0.75$. From FIG. 4 one can see that the 3-mm diameter seems to be a reasonable compromise between the better fidelity for fixing errors that a smaller source image would give and the lesser amount of ripple associated with a larger source. This will be shown in the next few sections.

The next problem is one of calculating the average mask transmission. An interferogram of the surface is needed. The interferograms known to the inventor that measure to better than 1 nm have about 80 resolution elements across the diameter since they are actually composites of many raw interferograms. They show some noise so they have to be smoothed. This could be done by convolving them with a Gaussian function (or something similar) that has a FWHM that is a few pixels wide. As per the discussion above, this convolution might better be done in transform space where it would be a product. Given this smoothing concept, the transmission of the mask might be calculated as follows:

1. Use a commercial fast fourier transform (FFT) routine on the interferogram data.
2. Multiply it by the smoothing function and if need be, throw away any residual noise representing spatial frequencies greater than $\eta \geq 0.2$ mm$^{-1}$.
3. Divide it by the sombrero function describing the source in transform space.
4. Inverse transform this data using the FFT routine. This gives a coarse grid of data points that describe the smooth mask transmission.
5. Fit a smooth function through this data so the mask transmission can be calculated locally.
6. Calculate the hole size (or spacing) in the mask.

Calculating the Ripple due to the Periodic Hole Pattern

Figure 5:
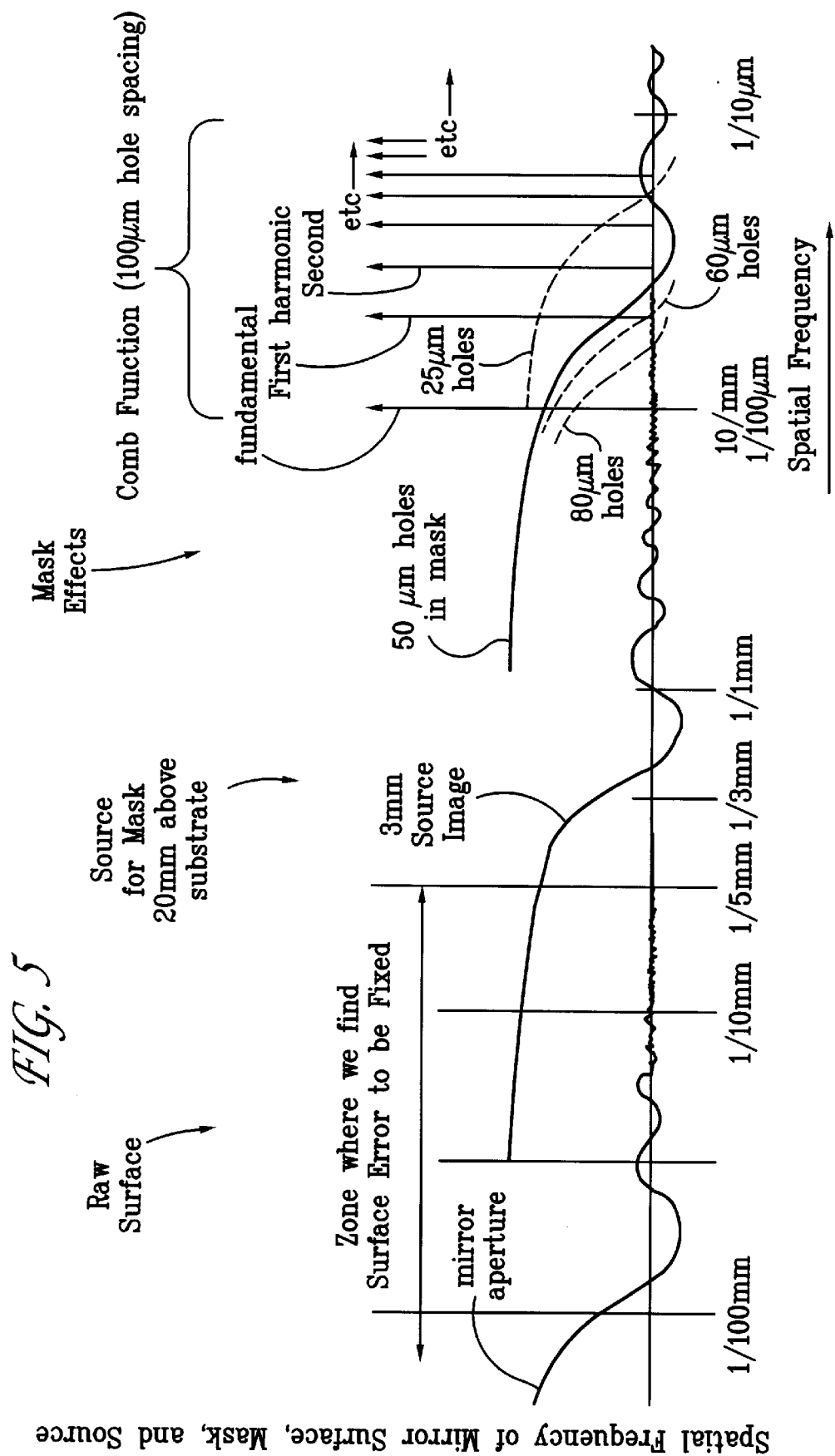
FIG. 5 is a graph of the spatial frequencies of the surface, the mask and the source.
Figure 7:
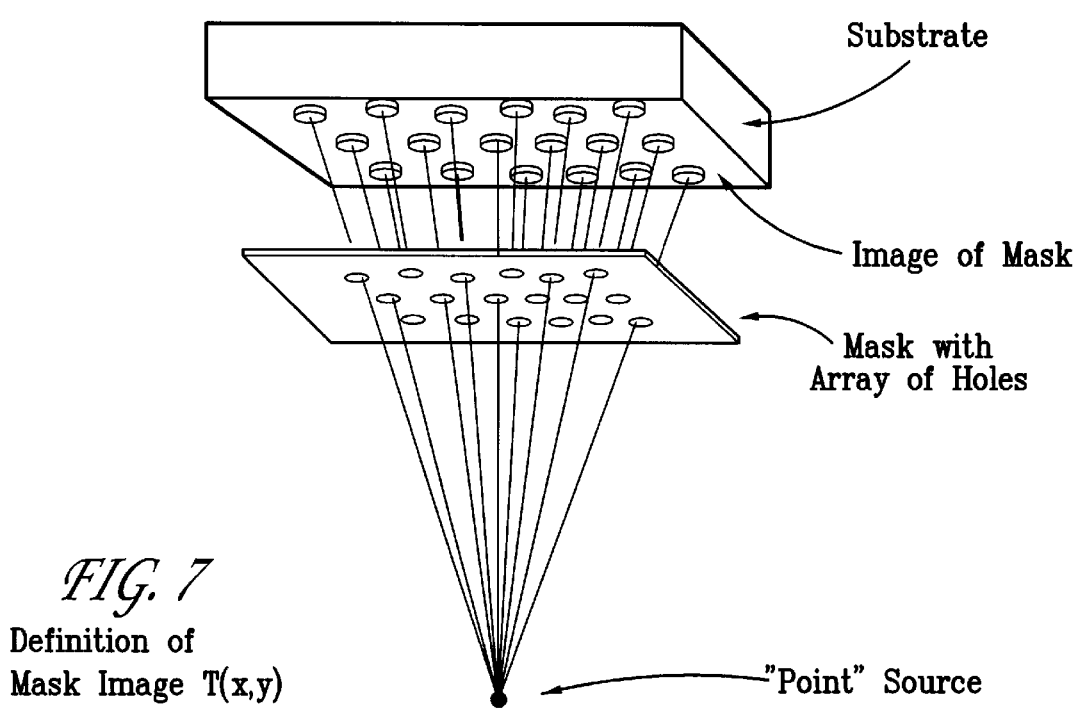
FIG. 7 is an isometric view of the mask image.

What follows is a model of one early experimental run which is shown in FIG. 5. It has a source diameter, $D_{source}$=12.7 mm, a source to mask distance, $L_{source\ to\ mask}$=200 mm, and a mask to substrate distance, $L_{mask\ to\ substrate}$=20 mm. The deposition on the substrate is a function of the geometry, the source size and shape, and the transmission function of the mask. The mask used was a square array of round holes. The grid spacing was $\Delta X = \Delta Y = 100\ \mu$m and the hole diameter was $D_{mask}$=50 $\mu$m. As described in the previous section, the deposition is the convolution of the source image on the substrate through a one-pinhole mask and the mask when the source is infinitesimally small. The mask image for a uniform array of holes is shown in FIG. 7. The image of the source has a diameter of $$d_{source}=D_{source}*L_{mask\ to\ substrate}/L_{source\ to\ mask}. \quad (4)$$

The image of the mask is a bit larger than the mask itself. Its magnification is $$m_{mask}=1+L_{mask\ to\ substrate}/L_{source\ to\ mask}. \quad (5)$$

Figure 6:
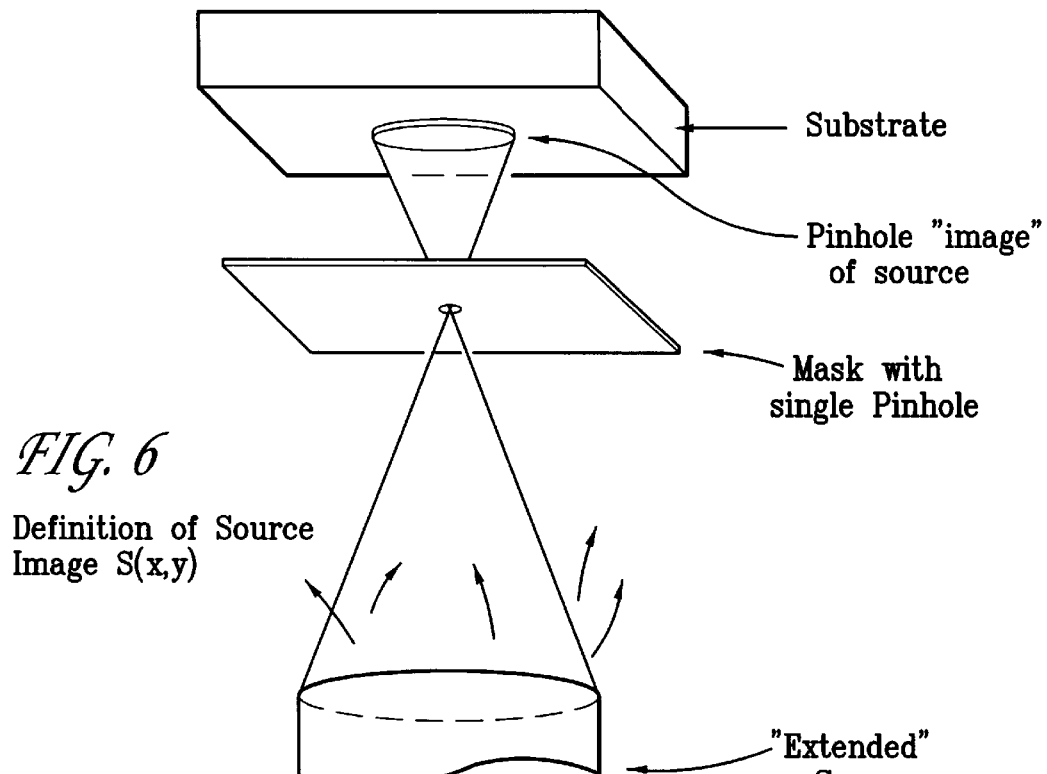
FIG. 6 is an isometric view of the source image.

In this experiment, the image of the grid pattern on the substrate will have 55-mm holes images located on 110-mm centers. The image of the source on the substrate in FIG. 6 has a 1.27 mm diameter. As a first approximation, assume that molecules of SiO exit the source uniformly over its aperture; that is, the effluent function appears to be a "top hat" function when viewed from the mask.

To simplify the math one chooses the 110-mm hole spacing on the substrate be a unit length; then one scales all of the other lengths. The diameters of the mask's hole images will therefore be $d_{mask}$=0.5 units and the size of the source image will be $d_{source}$=11.5 units.

The deposition can be described as a convolution of the source image and a square array of holes of (locally) constant diameter;

$$H(x,y)=\{Comb(x,y)Cyl(r/d_{mask})\}Cyl(r/d_{source}). \quad (6)$$

As with the macroscopic problem, this equation could be solved directly using numerical integration. However, more insight can be gained by studying it in the Fourier transform space. One can Fourier transform this function (Eqn. 6), sort the terms, and then transform it back into spatial coordinates. The end product of this effort is a Fourier series expansion describing the ripple. The fundamental term in this series has a period equal to the hole spacing in the mask image, $\Delta x$=110 $\mu$m.

The Fourier transform of Equation (6) is $$\{H(x,y)\}=Comb(a,b) \times Somb(D_{mask}\rho) \times Somb(D_{source}\rho). \quad (7)$$

The spatial frequency coordinates, a and b have units of mm$^{-1}$. The radially symmetric coordinate is $\rho=\sqrt{(a^2+b^2)}$.

Figure 8:
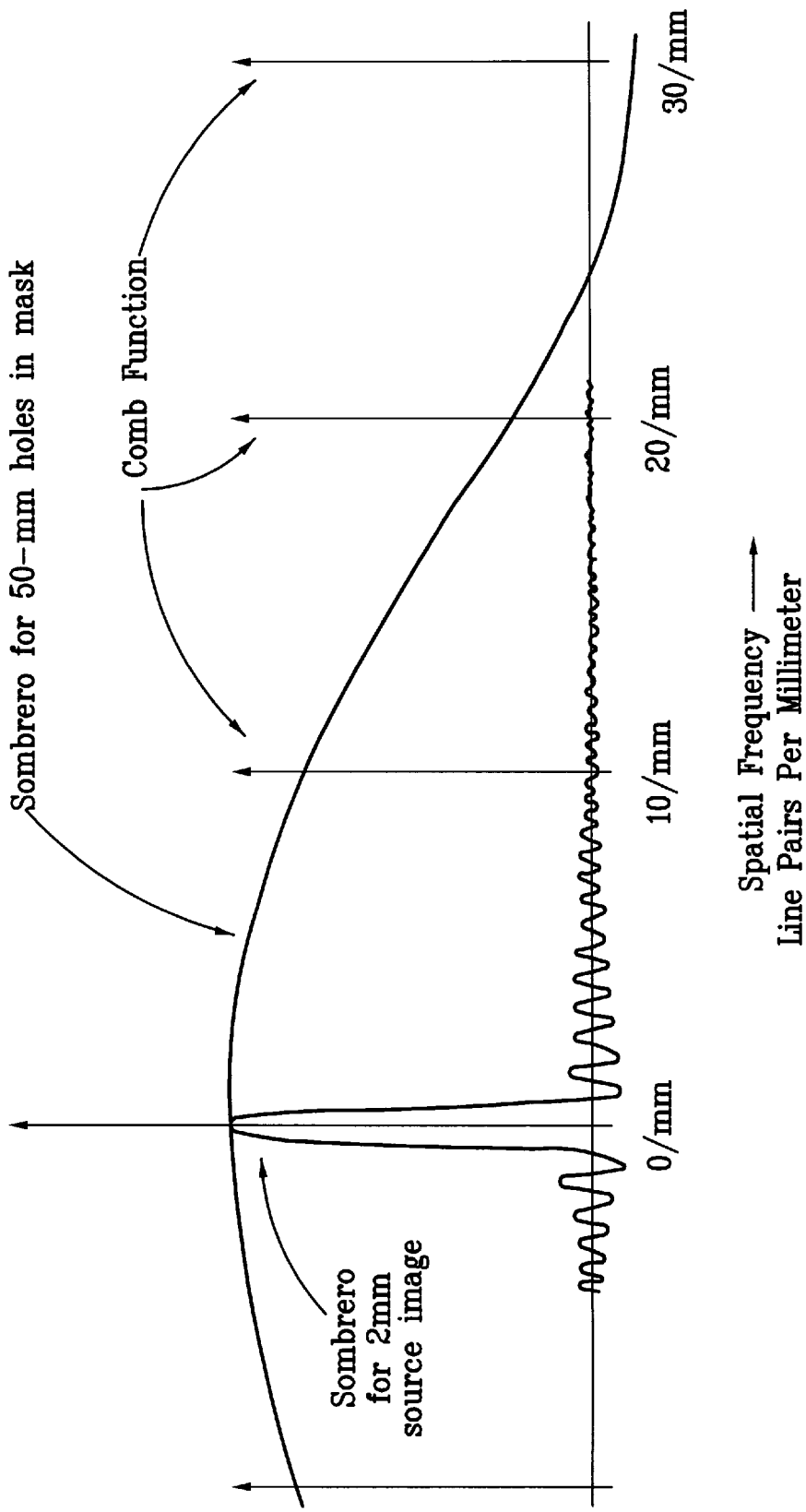
FIG. 8 is a graph of the Fourier transform of the square grid of apertures with 100 micron spacing between the apertures with the apertures being a constant 50 microns in diameter.

The transform of a comb function is another comb function; recall that a comb function is an infinite set of equally spaced delta functions. The transforms of the cylinder functions are defined by Gaskill (J. D. Gaskill, *Linear Systems*,

*Fourier Transforms, and Optics,* John Wiley & Sons, 1978, page 72) as "sombrero" functions, $F\{cyl(r/D)\}=somb(D\rho)=J_1(\pi D\rho)/(\pi D\rho)$, where J. is a Bessel function of the first kind. These functions are drawn in FIG. 8 for the parameters given.

The transform of the deposition, $H(x,y)$, is therefore the array of delta functions multiplied by a set of constants. The constant for a given delta function, $d(a-a_o,b-b_o)$, is equal to the product of the two sombrero functions evaluated at $a=a_o$, $b=b_o$.

One can choose to associate pairs of delta functions $dd(a_o,b_o)=d(a-a_o,b-b_o)+d(a+a_o,b+b_o)$ in the transform space. When one of these pairs is transformed back into spatial coordinates (x,y), it becomes $F(x,y)=\cos[2\pi x \cdot a_o] \cdot \cos[2\pi y \cdot b_o]$. This is simply one of the terms in the Fourier series describing the ripple. These Fourier terms are multiplied by constants which are simply the product of the two sombrero functions evaluated at the delta function's position.

The argument of the second Sombrero function is large when $\rho \geq 1$, so this function can be approximated by the asymptotic expansion $$\text{Somb}(\rho^* D_{source}) \approx \sqrt{2}/[\pi^2 D_{source}^{1.5}]\rho^{-1.5} \cos(D_{source}\pi\rho+0.75\pi). \quad (8)$$

This function can change significantly with small changes in the source diameter or magnification, $L_{mask-to-wafer}/L_{source-to-mask}$ (Eqn. 5). Hence, analyzing specific cases could be misleading. It is safer to calculate the maximum possible ripple using the envelope function, $$|\text{Somb}(D_{source}\rho)| \leq 0.14(D_{source}\rho)^{-1.5}. \quad (9)$$

One now has all of the pieces of the solution so one can do the inverse Fourier transform and calculate the ripple. One uses Equation (9) to represent the source instead of a sombrero function so the result will give a conservative estimate of the ripple. The sombrero function representing an average sized hole in the mask has a value of 0.72 for the fundamental terms in the ripple. Since the other terms are considerably smaller, one can estimate the maximum possible value of the first two terms in the Fourier series. This should give a conservative estimate of the surface height;

$$H(x,y)-H_o=0.28H_o(D_{source})^{-1.5}[\cos(2\pi x)+\cos(2\pi y)]. \quad (10)$$

Thus for this experiment one has an RMS surface roughness less than $$H_{RMS} \leq 0.28 \cdot D_{source}^{-1.5} H_o = 0.0072 \cdot H_o. \quad (11)$$

In the following section one can use this result plus the optical smoothness requirements and the mask fabrication tolerances to design the mask. One calculate an optimum grid spacing on the mask, the range of hole sizes in it, and the average depth of the deposition, $H_o$.

Resolution and Maximum Error

Another aspheric mirror had previously been prepared that serves as useful subject for analysis. It has a peak-to-peak surface departure from the desired aspheric shape that is slightly larger than 1 nm. One could estimate that a worst case error may be in the range of 3-nm surface error. This is (arbitrarily) chosen to be the maximum difference in deposition depth required. How accurately does one need to have to correct the surface so it can be used at extreme UV wavelengths ($\lambda_{EUV}$=13.4 nm)? That is, what should the minimum change in deposition depth be? To answer this question one could assume a large area that is low by half of the minimum step. What would its effect be on the Strehl ratio? Perhaps one could allow a 0.5% reduction in the Strehl. This implies an RMS wavefront error of 0.01125 $\lambda$=0.151 nm, which is equal to the average allowable step size. If this is divided into the maximum deposition depth, one finds that 20 equal steps are required; or more if the steps are unequal.

There are two cases of interest: 1.) fixed grid with varying hole sizes and 2.) fixed hole size with a varying grid spacing. If the grid is fixed and the hole size varies, then the minimum change in the area of the hole dictates the minimum step height change in the deposition. Mask vendors can offer a resolution of 1 micron so the minimum change in the diameter of a hole is 1 micron. The worst-case area change is thus $$A=\pi D_{max} \cdot 1 \ \mu m.$$

A problem: The diameters of the holes should not vary over a huge range since the etching step in the mask fabrication is not totally predictable. Perhaps a range of diameters of 1:2 is reasonable? Then the maximum hole diameter is $$20*A=\pi/4 \cdot D_{max}^2 \cdot 0.75,$$

so $$D_{max}=107 \ \mu m$$

and $$D_{min}=53 \ \mu m.$$

For this hole diameter the grid size will have to be greater than $$x \geq 150 \ \mu m.$$

The range of hole diameters gives the range in the average transmission; that is, it ranges from 0.25 $T_{max}$ to $T_{max}$. The errors to be corrected are equal to 3 nm so the maximum difference in deposition depth needs to be $H_{max}-H_{min}$=3 nm, which means $H_{max}$=4 nm. How much ripple might this hole pattern create? If the grid pattern is a 150-mm square grid and the source image on the surface has a 1.27-mm diameter, the ripple will be a sinusoid with a multiplier of $H_{RMS}^2$ 0.013 $H_o$=0.05 nm which is a bit smaller than an atomic diameter . . . which is acceptable.

Varying the Hole Positions rather than the Diameters

The holes can all have the same diameter if the grid spacing is allowed to vary. This design would not be too hard to implement if the spacing in the x direction were held constant and only the spacing in y were varied. For example, one could have a grid with a 100-$\mu$m spacing in x, and 50-$\mu$m diameter hole size, and a spacing in the y direction that varies from 75 $\mu$m to 150 $\mu$m. This mask would have a transmission that varies by as much as 2:1 with 75 different levels. The ripple in the y direction is set by the 100-$\mu$m grid spacing. The ripple in the x direction can be reduced to near zero. This can be done by choosing the location of the first hole in each row with a random number generator. As a result, the holes don't line up into columns so the effects of their locally periodic spacings add randomly.

Ripple in a Hexagonal Array of Holes

A hexagonal array of holes reduces the scatter due to ripple to about 25% of the value of an equivalent square array. If the principle dimension of a hexagonal array is unity, then the transmission for the surface can be written as $$T(x,y)=\{comb[x,y/1.732]+comb[x-0.5,(y-0.866)/1.732]\}*cyl(r/D_{mask})$$

The Fourier transform of this is $$t(a,b)=[1+(-1)^{m+n}]\cdot d(ma)\cdot d(1.732nb)\cdot somb(D_{mask}\,\rho)$$

As can be seen, half of the terms are zero including the fundamental terms. The first few terms in the Fourier series giving the ripple are $$H(x,y)=C_{0,0}+C_{2,0}\cos(2\pi x/0.5)+C_{0,2}\cos(2\pi y/0.866)=C_{1,1}\cos(2\pi x)\cos(2\pi y/1.732),\text{ etc.}$$

These Fourier components all have higher spatial frequencies than those in a square array with unit spacings. The sombrero functions that are multiplied by t(a,b) decrease rapidly for large values of $r=\sqrt{(a^2+b^2)}$. Hence the constants $C_{2,0}$, $C_{0,2}$, $C_{1,1}$, etc. are significantly smaller than those for a square array. In fact, the scattered light should be about 25% as large as for an equivalent square array.

Summary of Mask Design Trade-Offs for the EUVL Case

Requirements and Limitations: One needs to be able to deposit coatings with a maximum difference in depth of about 3 nm. The coatings need a thickness resolution of about 0.15 nm to keep the scatter in a reasonable range. The features on the masks can be made with a 1-mm accuracy.

Varying the Mask Transmission: If the grid spacing in the mask is to be fixed and the hole diameter is to vary to give the coating thickness variations, then the coating must be quite thin. As stated above, the thickness needs to vary from $1\text{ nm}\leq H(x,y)-H_o\leq 4\text{ nm}$. This may not be possible if the coating exhibits "island growth". However, the good news is that the ripple is minuscule. To give the 0.15-nm surface height accuracy, the holes must vary from 53 $\mu$m to 107 $\mu$m in diameter. This implies a grid size of about 150 $\mu$m. A fixed hole diameter with a variable grid spacing offers a greater choice of coating thickness ranges. The resolution and range can be had with average coating thicknesses of up to 15 nm. The ripple resulting from this hole pattern and coating thickness is still small. A reasonable choice of hole diameter is 55 $\mu$m with a 100-$\mu$m average hole spacing.

First Order Parameters for Deposition: The system has a 12.7-mm diameter source of SiO. The source-to-surface distance is about 220 mm. One needs to keep the image of the source on the surface (as seen through one pinhole in the mask) in a range of 1.27-mm to 2-mm in diameter . . . so the mask to surface distance should be in the range 20 mm to 30 mm.

Dithering the Source

Because of the interaction between the hard edges of the source and the somewhat regular pattern of the aperture grid, deposition through the mask will usually produce a mild ripple in the deposited material. Dithering the source (or the mask) is one way to prevent this effect from occuring. What is proposed in the previous sections assumes that one can use a coating that varies from $1\text{ nm}\leq H_{coating}\leq 4\text{ nm}$. Evaporative coatings may not be uniform when they are this thin. Another solution to this problem may be to deposit a uniform coating with the mask removed either before or after the variable thickness layer is deposited.

The discontinuity at the edge of the cylinder function gives the ringing in its Fourier transform. If the edge were smoothed, the ringing could be greatly reduced. This could be done by "dithering" the source; that is, moving it around in some pattern during the deposition. The edge of the time-integrated source might therefore be softened. The question is, what should the pattern be, and how large should it be?

One can look at two cases first: 1.) The source motion could "paint" a gaussian distribution and 2.) it could be just moved in a circle. The gaussian motion would make the source appear as $$S_{gaus}(r)=Cyl(r/D_{source})**Gaus(r/\sigma)$$

where $Gaus(r/\sigma)=\exp[-92\,(r/\sigma)^2]$ The Fourier transform of this source would be $$\{S_{gaus}(r)\}=Somb(D_{source}\rho)\times Gaus(\sigma\rho).$$

If the source motion has a gaussian radius of about one period of the grating, $\sigma=1$, then at $\rho=1$ the gaussian will be small; Gaus(1)=0.043 . . . so the ripple will be 23 times smaller than the undithered case.

When the source is moved around in a circle, the time-averaged deposition would be $$S_{circle}(r)=Cyl(r/D_{source})**\{Cyl[r/(D_{ring}+\delta)]-Cyl[r/(D_{ring}-\delta)]\}/(2\delta)$$

for $\delta\rightarrow 0$. Taking the Fourier transform of this equation yields $$\{S_{circle}(r)\}=Somb(D_{source}\rho)\times[J_0(x)/x-2J_1(x)/x^2]$$

where $x=D_{ring}\rho$. Note that the transform of the ring does not become small until x becomes large, and then it approaches an asymptotic solution with an envelope identical to that of the sombrero function. Hence, the circular motion of the source image on the substrate would have to be large (5x?) relative to grid image. There are two other possible motions—one uniformly fill a cylinder, that is, uniform dwell time per unit area; and the other paints a conical function where the dwell time reduces linearly with radius. The sources for these two time-averaged sources are $$S_{cyl-motion}=Cyl(r/D_{source})**Cyl(r/D_{cyl-motion})$$

and approximately $$S_{cone-motion}\text{Å }Cyl(r/D_{source})[Cyl(2r/D_{cone-motion})Cyl(2r/D_{cone-motiod})]$$

The Fourier transforms for these two functions are $$\{S_{cyl-motion}\}=Somb(D_{source}\rho)\times Somb(D_{cyl-motion}\rho)$$

and $$\{S_{cone-motion}\}=Somb(D_{source}\rho)\times[Somb(D_{cone-motion}\rho/2)]^2$$

Both of these new sombrero functions decrease proportional to the argument raised to the 1.5 power. A sombrero function rings; it has maxima and minima that reach −13%, 6%, −4%, etc. Therefore the cylindrical motion needs a diameter greater than $D_{cyl-motion}\geq 2.2$ to achieve a reduction of the ripple to less than 4% of the fixed-source value. The Fourier transform of the cone motion is equal to a sombrero function squared, but the argument is smaller. Therefore, a cone diameter greater than $D_{cone-motion}\geq 2.4$ reduces the ripple by $[13\%]^2$, which reduces the ripple to 1.75% of the unmoved value. The dithering displacement is typically less than the hole spacing in the mask.

We claim:

1. A method for correcting imperfections on a surface comprising:

measuring the surface profile of the surface;

fabricating a multi-aperture mask with a sufficient number of apertures such that a point on the surface will receive deposition through at least about 75 different apertures, the mask being designed such that deposition of a material through the apertures in the mask will correct the surface imperfections;

interposing the multi-aperture mask between a vapor deposition source for the material and the surface to be corrected; and depositing material from the deposition source though the mask onto the surface in a predetermined amount sufficient to correct the imperfections to an acceptable level.

2. The method of claim 1 wherein the surface is a previously-polished optical surface.

3. The method of claim 2 wherein the surface is a reflective, aspheric optical surface.

4. The method of claim 1 wherein the source is a vacuum vapor deposition source.

5. The method of claim 4 wherein the material is one that forms an amorphous layer upon the surface.

6. The method of claim 5 wherein the material is SiO.

7. The method of claim 1 wherein the design of the mask comprises:

(a) subtracting a desired shape of the surface from the measured surface profile of the surface;

(b) taking a Fourier-transform of the result of step (a);

(c) dividing the result of step (b) by a Fourier-transform of output aperture of the deposition source;

(d) taking an inverse Fourier-transform of the result of step (c) to describe the mask transmission;

(e) calculating the aperture sizes for the mask if using constant grid spacing or the aperture locations for the mask if using constant aperture size.

8. The method of claim 1 wherein the design of the mask comprises:

(a) subtracting a desired shape of the surface from the measured surface profile of the surface;

(b) taking a Fourier-transform of the result of step (a);

(c) dividing the result of step (b) by a Fourier-transform of output aperture of the deposition source;

(d) taking an inverse Fourier-transform of the result of step (c) to describe the mask transmission;

(e) calculating the aperture sizes for the mask if using constant grid spacing or the aperture locations for the mask if using constant aperture size.

9. The method of claim 8 further including a correction factor for a curved surface.

10. A method for correcting imperfections on a previously polished optical surface comprising:

measuring the surface profile of the surface;

fabricating a multi-aperture mask with a sufficient number of apertures such that a point on the surface will receive deposition through at least about 75 different apertures, the mask being designed such that deposition of a material through the apertures in the mask will correct the surface imperfections;

interposing the multi-aperture mask between a vapor deposition source for the material and the surface to be corrected; and depositing material from the deposition source though the mask onto the surface in a predetermined amount sufficient to correct the imperfections to an acceptable level.

11. The method of claim 10 wherein the surface is a reflective, aspheric optical surface.

12. The method of claim 10 wherein the source in a vacuum vapor deposition source.

13. The method of claim 10 wherein the material is one that forms an amorphous layer upon the surface.

14. The method of claim 13 wherein the material is SiO.

15. The method of claim 10 wherein the thickness of the deposited material is less than about 600 nm.

16. The method of claim 10 wherein one member of the group consisting of the source, the mask, and the surface is dithered relative to the other two members of the group.

17. The method of claim 10 wherein the optical surface is selected from the group consisting of spherical and aspheric surfaces.

* * * * *